(12) United States Patent
Davis

(10) Patent No.: US 6,380,527 B1
(45) Date of Patent: Apr. 30, 2002

(54) METHOD AND APPARATUS FOR READING FROM AND WRITING TO A STATIONARY OPTICAL STORAGE DEVICE

(76) Inventor: Frank Davis, 210 Glen Park, Houston, TX (US) 77009

( * ) Notice: Subject to any disclaimer, the term of this patent is extended or adjusted under 35 U.S.C. 154(b) by 0 days.

(21) Appl. No.: 09/102,727

(22) Filed: Jun. 22, 1998

Related U.S. Application Data

(60) Provisional application No. 60/050,493, filed on Jun. 23, 1997.

(51) Int. Cl.[7] .................................................. G02B 7/04
(52) U.S. Cl. ..................................... 250/201.5; 250/216
(58) Field of Search .............................. 250/201.5, 216, 250/208.1, 578.1; 257/440, 80–85; 369/44.25, 44.29, 94

(56) References Cited

U.S. PATENT DOCUMENTS

| | | | | |
|---|---|---|---|---|
| 4,835,595 A | * | 5/1989 | Oho et al. ..................... | 257/81 |
| 5,757,744 A | * | 5/1998 | Akkermans .............. | 369/44.25 |

* cited by examiner

Primary Examiner—Que T. Le
(74) Attorney, Agent, or Firm—James L. Jackson, Esq.; Andrews & Kurth

(57) ABSTRACT

An opto-electronic data acquisition and storage system, having a light source for directing light along a predetermined light path, a light sensitive electronic memory, a light absorber, a spatial optical storage device being positioned to receive reflected light and to direct the reflected light to the light sensitive electronic memory and a digital light processor having an array of electronically positioned micromirrors each being selectively oriented to a reflecting position to reflect light from the light source along a reflected light path to the spatial optical storage device for data storage and being selectively oriented to reflect light from said source to the light absorber when the reflected light is not intended for storage. This invention also includes an opto-electronic circuit for electronic signal and data processing and storage, having a layered electronic circuit matrix having a plurality of light sensitive layers each having a multiplicity of electronic circuit components being sensitive to light of a predetermined wave-length. The light system generates light beams of differing wave-length; and controls the light beams to program an infinite variety of electronic circuits within the light sensitive layers of the electronic circuit matrix.

13 Claims, 2 Drawing Sheets

METHOD AND APPARATUS FOR READING FROM AND WRITING TO A STATIONARY OPTICAL STORAGE DEVICE

Applicant hereby claims the benefit of U.S. Provisional application Ser. No. 60/050,493, filed on Jun. 23, 1997 by Frank Davis and entitled Method and Apparatus For Reading From And Writing To A Stationary Optical Storage Device.

BACKGROUND OF THE INVENTION

1. Field of the Invention

This invention generally concerns electronic data memory systems and more specifically, is directed to an optoelectronic data acquisition and storage system having the capability for simply, efficiently and inexpensively handling a vast quantity of data from the standpoint of acquisition (reading), to handle data in parallel or serially. The invention also concerns the provision of a plurality of templates having photonicly programable circuitry and having characteristics of essentially infinite circuit programmability.

2. The Prior Art

Due to the fact that many electronic circuit components are "hard wired", the data processing speed of such circuitry is restricted by electronic signal transfers that can be achieved through the hard wired circuit components. It is desirable, therefore, to provide photonically sensitive electronic circuitry which is not composed of hard wired components but which incorporates light sensitive components which employ the inherent speed of reflected light and provide for data or signal transfer of significantly enhanced speed.

SUMMARY OF THE INVENTION

There is disclosed a method and a system for reading from a stationary optical storage device. The system is comprised of a light source, a digital light processor, a stationary optical storage device, and a receptor. The light source/sources are individually monochromatic and do not exclude but can include many regions of the spectral bandwidth, from (IR) infrared to ultraviolet (UV). The digital light processor (DLP) is a large-scale integrated spatial light modulator (DMD) comprising a large array of electrically controllable moveable and positionable micro-mirrors each having electrically engaged and disengaged positions. When electrically engaged an individual micro-mirror reflects light from the source to an optical storage device. When electrically disengaged, the micro-mirror is then positioned to reflect light from the source to a light absorber so that its portion of the light is not reflected to the optical storage device. The stationary optical storage (SOS) device comprises an array of holographically recorded data sets. The receptor can be any number of CCD15 like, CMOS image recovery devices, or light amplitude and frequency sensitive photo-active circuitry. The light source is processed through an optical set so that the beam is of the same size as the DMD and impinges upon the DMD in such a way as to cover the entire array of micro-mirrors with a uniformly distributed monochromatic light/lights.

The number and configuration of micro-mirrors on the DMD is a mirror image of 20 the number and configuration of data cells in the optical storage device, such that optical paths $A_l$ through $A_n$ from the DMD optically align with corresponding data cells $S_l$ through $S_n$ on the optical storage device. However, the array of receptors and the configuration of the individual data cells are not necessarily the same configuration as the matching arrays of the micro-mirrors and the data cells on the optical storage device.

As individual micro-mirrors are electrically engaged, portions of the beam distributed uniformly over the micro-mirror array of the DMD are caused to impinge upon specific cells in the optical storage device. The angle of this impingement is such that, as individual micro-mirrors in the DMD are electrically engaged, a free space optical interconnection is established between an individual micro-mirror and its matching cell on the optical storage device; thus each micro-mirror re-directs a segment of the light beam from the light source to a corresponding data cell on the multi-cell array of the optical storage device. This beam path is highly selective in that it does not impinge upon any other cell in the multi-cell array of the optical storage device. Every cell in the optical storage device array has been holographically recorded so that any beam segment from any micro-mirror on the DMD is defracted by the micro-mirror's matching cell on the optical storage device, causing this beam to diverge to the proper proportions and array alignment of the receptor and at the proper divergent angle so that it impacts and is aligned with the receptor array. Regardless of the optical path along which a beam forms, an optical interconnection between the DMD and optical storage device, the resulting defracted beam will always align with the receptor array. Data recorded in the cell also diverges with the beam, but are not necessarily consistent with the number, size, shape or configuration of the matching DMD/optical storage device set.

Some micro-mirrors of the DMD and their matching cells on the stationary optical storage device are reserved for devices other than the main receptor array, including devices for timing, distribution, categorizations, address', decoding information, etc.

When any micro-mirror is electrically disengaged, its off-angled position directs the beam segment to a light absorbing material so that it does not impinge upon any cell in the optical storage device array, preventing scattering to any photo-active device, improving signal-to-noise ratios and precluding interference. The optical storage device is also positioned so that it will not be impinged by a beam segment from any mirror that is electrically disengaged.

One embodiment of the receptor can be a CCD or CMOS array onto which a pattern representing the data is refracted off of the SOS at a certain angle as to be aligned with the receptor array. The pattern of light and dark squares match the light sensitive array in size and number. The data having been transferred photonically to the array can be read in parallel, serially, or can be treated as in the case of a CMOS array, as memory itself.

Another embodiment of a receptor can be a wafer on which one side has been processed many non-interconnected logic, counters, processing units etc. Contiguous to the units, and phonically accessible from the SOS, paths for interconnecting the devices in a variety of architectures are accomplished through selective illumination by amplitude and frequency of refracted patterns from the SOS. The photoactive materials become selectively conductive by the amplitude and frequency sensitivity to the refracted schematic image. The non-connected units are connected in accordance to the schematic refracted off of the SOS. Thus a chip of this kind can be "rewired" or "reprogrammed" to perform as many different chips as there are individual mirrors on the DMD and holographically recorded on the SOS. With a tilt of a micro-mirror, monochromatic light can be directed to a specific area on the SOS that contains the desired holographically recorded schematic, which schematic is then refracted to and photonically creates electrical connections between different devices on the wafer.

BRIEF DESCRIPTION OF THE DRAWINGS

So that the manner in which the above recited features, advantages and objects of the present invention are attained and can be understood in detail, a more particular description of the invention, briefly summarized above, may be had by reference to the preferred embodiment thereof which is illustrated in the appended drawings, which drawings are incorporated as a part hereof.

It is to be noted however, that the appended drawings illustrate only a typical embodiment of this invention and are therefore not to be considered limiting of its scope, for the invention may admit to other equally effective embodiments.

In the Drawings:

FIG. 1 is an opto-electronic schematic illustration showing parallel handling of 15 optical data for electronic acquisition thereof;

Figure 2:
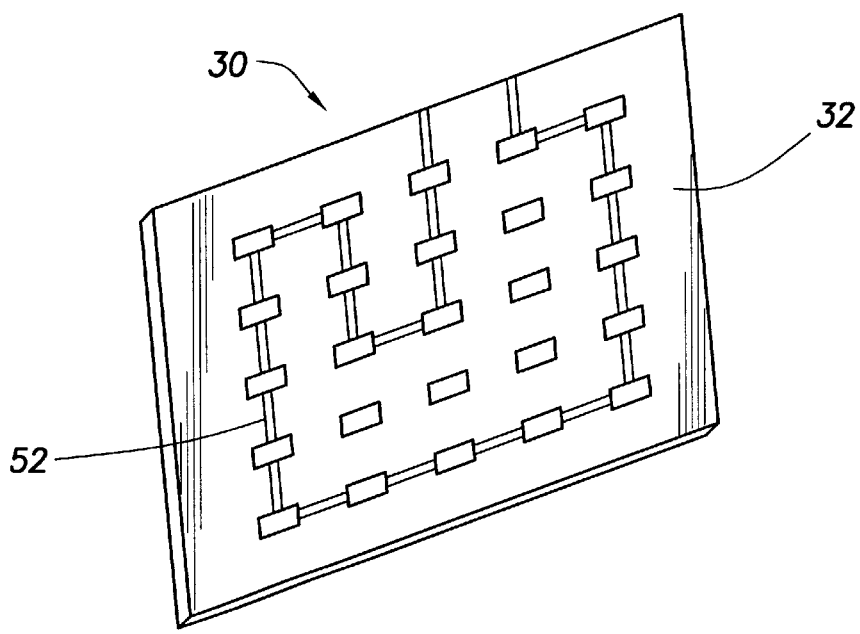
Figure 3:
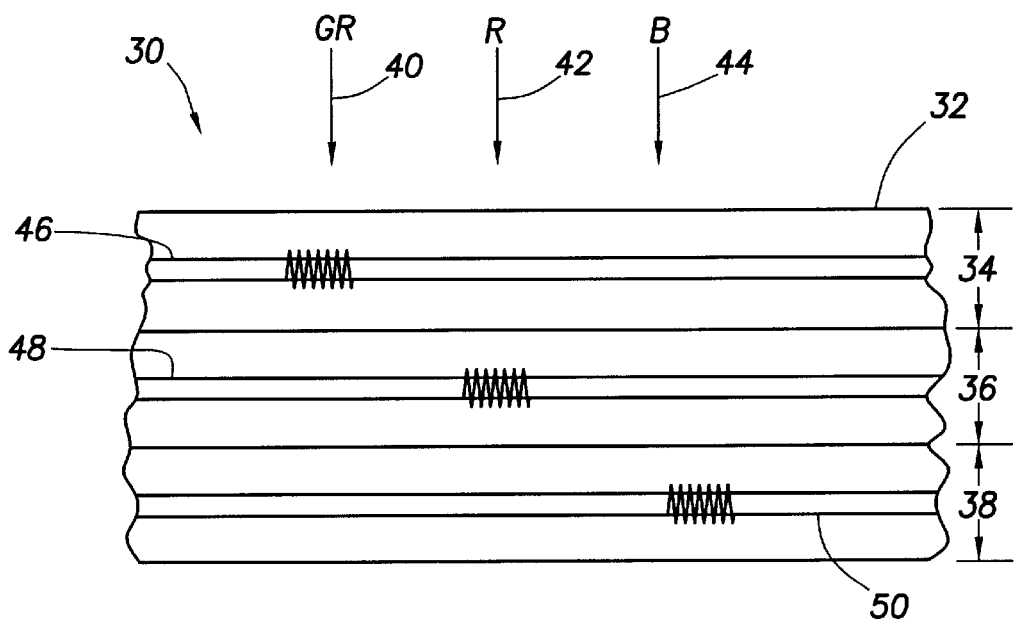

FIG. 2 is an isometric illustration showing a panel having a multiplicity of photonically energized micro-mirrors being controllably energized by light of differing wave lengths for the purpose of selectively establishing electronic circuitry within the panel; and FIG. 3 is a fragmentary sectional view of the photonically energized panel of FIG. 2, illustrating photonic activation of circuit components by light of differing wave length, red and green for example, for the purpose of completing electronic circuit components within the panel matrix.

DETAILED DESCRIPTION OF PREFERRED EMBODIMENT

Figure 1:
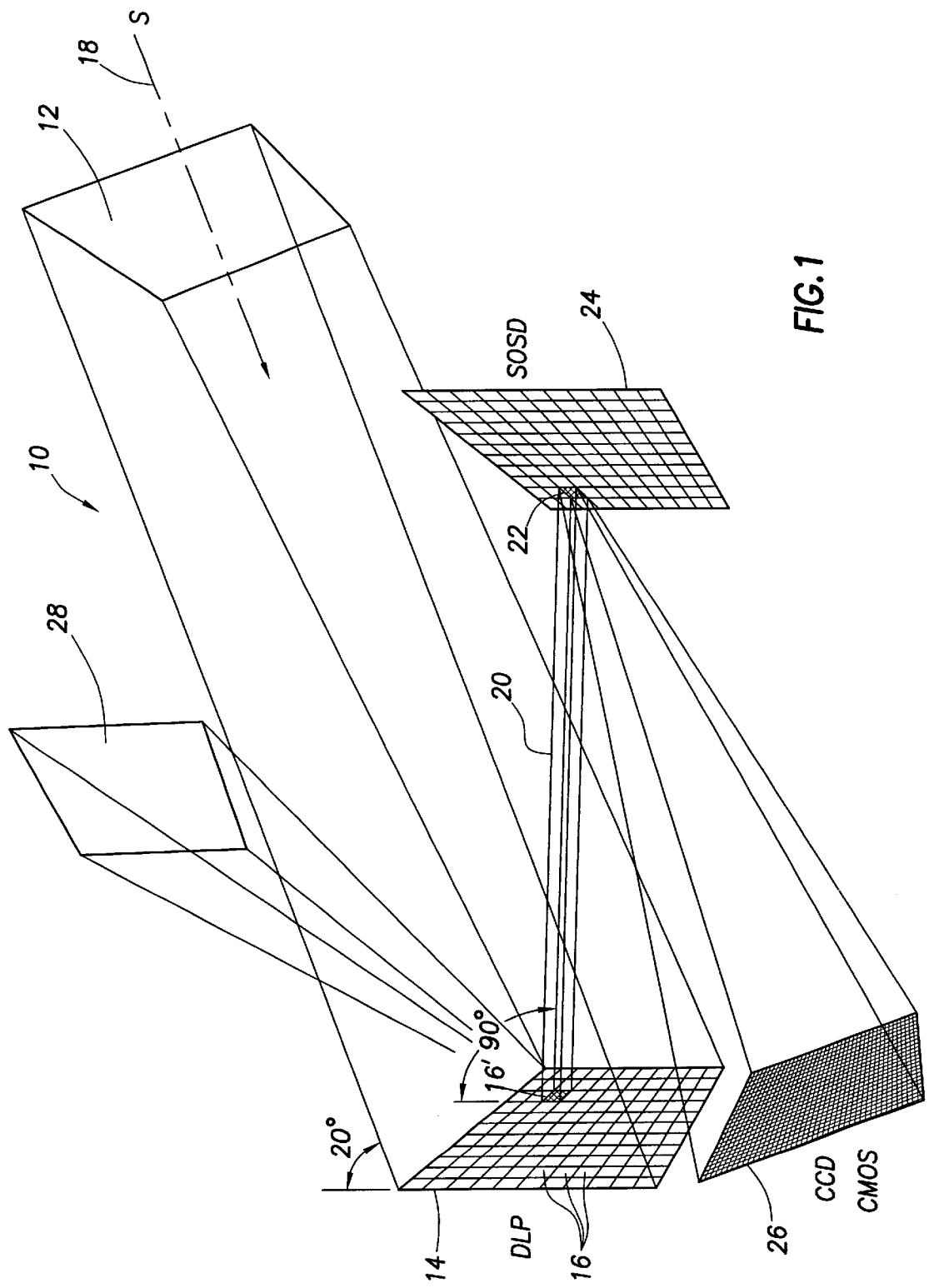

Referring now to FIG. 1, opto-electronic apparatus for handling and storage of optical data is shown generally at 10 by means of an optical data handling diagram wherein light from a source S passes through a plane 12 as it travels to a digital light processor 14. The light plane 12 and the digital light processor are of the same configuration so that light passing through the plane 12 will travel in parallel manner to respective locations on the digital light processor 14. The digital light processor is provided with a multitude of micro-mirrors 16 which define its light reflective surface so that light can be reflected from the plane of the digital light processor as shown, the plane of the digital light processor is inclined 20° with respect to the light plane 12; thus light traveling along light path 18 will be reflected from a micro-mirror at an angle of 90° with respect to the plane of the digital light processor. In the diagrammatic representation shown in FIG. 1, light from the source S and striking the micro-mirror 16 will be reflected along light path 20 to a respective optical storage panel 22 of an optical data storage device 24 having a multitude of optical storage panels, each having a reference with a respective micro-mirror 16 of the digital light processor 14.

An electronic memory in the form of a compact computer disk (CCD) or complimentary metal-oxide semi conductor (CMOS) imaging device is positioned in appropriate angular relation with the optical storage device 24 as shown. Data being refracted from a particular panel 22 of the optical storage device 24 will be directed to the recording panel 26 for impingement on selected ones of a multitude of micro-panels of the recording panel. The recording panel will take the form of a computer memory, thus permitting the image being refracted thereof to be recorded in parallel fashion rather than in serial fashion.

The digital light processor 14, as mentioned above, will be provided with a multitude of micro-mirrors which constitute its reflective surface. Each of these micro-mirrors has two positions, one position being referred to as an active position for directing optical data to the optical storage device. Each micro-mirror also has an inactive position where it is positioned at an angle for reflecting light to a light absorber 28. The active and inactive positions of each micro-mirror is determined electronically so that opto-electronic data storage can occur selectively.

Referring now to FIGS. 2 and 3 a photonical sensitive electronic circuit panel is shown generally at 30 which incorporates a matrix support 32 having a plurality of wavelength sensitive circuit matrixes 34, 36 and 38 each having a multiplicity of circuit components that are activated by controlled beams 40, 42 and 44 of light of a predetermined wave-length, such as, for example, green, red, blue, infrared, ultra violet, etc. By controllably directing the beams of light, the light sensitive layers 46, 48 and 50 of each of the layered matrixes are selectively activated, thus causing programming of a selected electronic circuit 52 within the matrix support panel for conducting a specific electronic process. The light beams 40, 42 and 44 can be controllably energized to thus selectively program the matrix support panel with an essentially unlimited number of differing electronic circuits as desired for processing of electronic data or selective activation or deactivation of various electronic circuit components.

I claim:

1. An opto-electronic light programmable circuit system for electronic signal and data processing and storage, comprising:

(a) an electronic circuit matrix having therein a plurality of light sensitive layers each light sensitive layer having a multiplicity of electronic circuit components, each electronic circuit component being sensitive to light of a predetermined wave-length;

(b) a plurality of controllable light emitting elements each generating light beams of differing wave-length and directing the light beams onto said electronic components of said electronic circuit matrix; and (c) means controlling said light beams to program electronic circuitry comprising light selected components within said plurality of light sensitive layers of said electronic circuit matrix.

2. The opto-electronic circuit of claim 1, wherein:

said controlling said light beams being selectively actuateable for selectively activating said electronic components of each of said plurality of light sensitive layers and creating substantially infinite electronic circuit programming within said plurality of light sensitive layers of said layered electronic circuit matrix.

3. The opto-electronic circuit of claim 1, wherein:

(a) said matrix support being light penetrable; and (b) said light sensitive layers being spaced from one another.

4. The opto-electronic circuit of claim 1, wherein:

(a) said matrix support being penetrable by light of a variety of selected wave lengths; and (b) said light sensitive layers each having light sensitive electronic components each being activated or deactivated responsive to light of a predetermined wave length and collectively defining an electronic circuit responsive to a controlled pattern and wave length of light being controllably applied to said matrix support.

5. The opto-electronic circuit of claim 4, wherein:
(a) said light sensitive layers being disposed in spaced relation with one another; and
(b) said controlled beams of light having a variety of selective wave lengths and being controllable to establish electronic circuitry within said light sensitive layers and being further controllable to establish differing electronic circuitry within said light sensitive layers.

6. The opto-electronic circuit of claim 5, wherein:
said controllable beams of light being selectively controllable to establish a substantially unlimited number of differing electronic circuits within said light sensitive layers of said light sensitive layers.

7. The opto-electronic circuit of claim 1, wherein:
(a) said matrix support having a plurality of light wave length sensitive matrixes; and
(b) each of said light wave length sensitive matrixes having therein a light sensitive layer capable of assuming an electronic circuit responsive to light of predetermined wave lengths.

8. The opto-electronic circuit of claim 7, wherein:
(a) said plurality of controlled beams of light each having a desired wave length; and
(b) said plurality of controlled beams of light being selectively controlled to collectively establish desired electronic circuitry within said plurality of light sensitive layers.

9. An opto-electronic light programmable circuit system for electronic signal and data processing, comprising:
(a) a plurality of light sensitive matrixes collectively defining a matrix support and being arranged in layers within said matrix support;
(b) a light sensitive layer being located within each of said light sensitive matrixes, said light sensitive layers being disposed in spaced relation with one another; and
(c) a plurality of controllable light beams being directed to said matrix support and penetrating said light sensitive matrixes, said light beams being selectively controllable to controllably activate said light sensitive layers and define selected electronic circuits within said light sensitive layers.

10. The opto-electronic light programmable circuit system of claim 9, comprising:
(a) said plurality of light beams each having a selected light wave length; and
(b) said plurality of light sensitive layers being selectively activated and deactivated by said light beams and defining electronic circuitry by selective control of said light beams.

11. The opto-electronic light programmable circuit system of claim 9, comprising:
(a) said light sensitive layers being disposed in spaced relation with one another; and
(b) said controlled beams of light having a variety of selective wave lengths and being controllable to establish electronic circuitry within said light sensitive layers and being further controllable to establish differing electronic circuitry within said light sensitive layers.

12. The opto-electronic light programmable circuit system of claim 11, comprising:
said controllable beams of light being selectively controllable to establish a substantially unlimited number of differing electronic circuits within said light sensitive layers of said light sensitive layers.

13. The opto-electronic light programmable circuit system of claim 9, comprising:
(a) said plurality of controlled beams of light each having a desired wave length; and
(b) said plurality of controlled beams of light being selectively controlled to collectively establish desired electronic circuitry within said plurality of light sensitive layers.

\* \* \* \* \*